United States Patent [19]

Carette et al.

[11] 4,298,817
[45] Nov. 3, 1981

[54] ION-ELECTRON SOURCE WITH CHANNEL MULTIPLIER HAVING A FEEDBACK REGION

[76] Inventors: Jean-Denis Carette, 1409 rue St-Clement, Ancienne Lorette, Quebec, Canada, G2E 3L7; Claude Bouchard, 1680 Carré Ader, Apt. 2,, Duberger, Quebec, Canada, H1P 1H8

[21] Appl. No.: 66,058

[22] Filed: Aug. 13, 1979

[51] Int. Cl.³ .................. H01J 43/04; H01J 27/02
[52] U.S. Cl. .................. 313/362.1; 313/103 CM; 313/231.31; 313/363.1
[58] Field of Search ............ 313/103 CM, 231.3, 362, 313/105 CM, 363, 359

[56] References Cited

U.S. PATENT DOCUMENTS

| | | | |
|---|---|---|---|
| 2,258,149 | 10/1941 | Schütze | 313/359 |
| 3,271,661 | 9/1966 | Goodrich et al. | 313/103 X |
| 3,612,946 | 10/1971 | Toyoda | 313/103 X |
| 3,673,449 | 6/1972 | Eschard | 313/105 |

OTHER PUBLICATIONS

"A Straight Channel Multiplier Used as a Low-Energy Ion Source," by R. D. Andresen and D. E. Page, *Nuclear Instruments and Methods*, vol. 88, No. 1, pp. 99–104 (1970), North-Holland Publishing Co.

*Primary Examiner*—Palmer C. Demeo
*Attorney, Agent, or Firm*—Cushman, Darby & Cushman

[57] ABSTRACT

The ion-electron source described herein comprises an electron multiplier consisting of a straight tubular channel that includes an emitting region for the production of secondary electrons by ion impact, the channel being narrowed near one of its extremities; an inlet is provided by which gas at a predetermined pressure can be introduced in the channel multiplier; a sufficient voltage polarization allows the multiplier to operate in a self-sustained cascade mode; the source also includes an aperture by which ion current is ejected.

11 Claims, 7 Drawing Figures

ION-ELECTRON SOURCE WITH CHANNEL MULTIPLIER HAVING A FEEDBACK REGION

The present invention relates to an ion-electron source made from a straight channel electron multiplier operated in the self-sustained cascade mode, i.e. in an equilibrium state where ion and electron currents are constant inside the multiplier.

One of the advantages of such an ion-electron source is its low power requirements and the fact that it employs no heater or filament, thus being a cold source. It is known that straight channel electron multipliers exhibit ion feedback when operated in a moderate vacuum environment. Ion feedback is usually considered as a nuisance in normal channel multiplier applications. However, it is possible to use ion feedback to produce an ion source. For this purpose, instead of trying to eliminate ion feedback, different ways have been considered to enhance it in order to produce the large amount of ions which is desired. It is possible to make an ion source with a straight channel multiplier where no feedback enhancing means are used. In such a source, the feedback is provided by the collisions of the back accelerated ions with the beginning or entrance region of the channel, the walls of which emit secondary electrons that are multiplied along the channel and give the secondary pulses which are so bothersome in detectors made from such straight channels. However, in trying to make an ion source from a straight channel multiplier, it has been found that feedback was to be useful only in ion sources that operate at relatively low pressure (say $10^{-6}$ torr) and that are externally triggered, for example by a radioactive $\beta$-ray source.

One object of this invention is the provision of means for enhancing the ion production by a straight channel electron multiplier while eliminating the need for an external triggering source.

The present invention therefore pertains to an ion-electron source which comprises: an electron multiplier consisting of a straight tubular channel, the channel including an emitting region for the production of secondary electrons by ion impact, the region being formed by a narrowing of the channel at one extremity thereof; the source also comprises inlet means for admitting a gas at a predetermined pressure in the electron multiplier, voltage polarization means for operating the electron multiplier in a self-sustained cascade mode and output aperture means for ejecting ion current formed in the channel.

Other objects and further scope of applicability of the present invention will become apparent from the detailed description given hereinafter; it should be understood, however, that this detailed description, while indicating preferred embodiments of the invention, is given by way of illustration only since various changes and modifications within the spirit and scope of the invention will become apparent to those skilled in the art.

Figure 1:
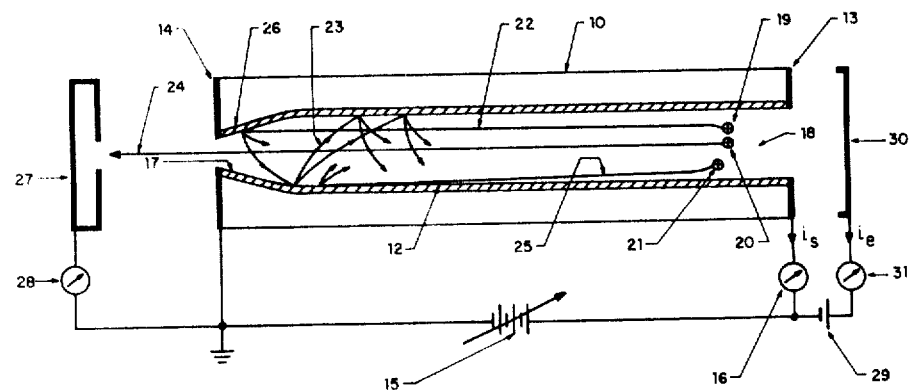
FIG. 1 is a longitudinal sectional view of a first embodiment of the present invention.
Figure 2:
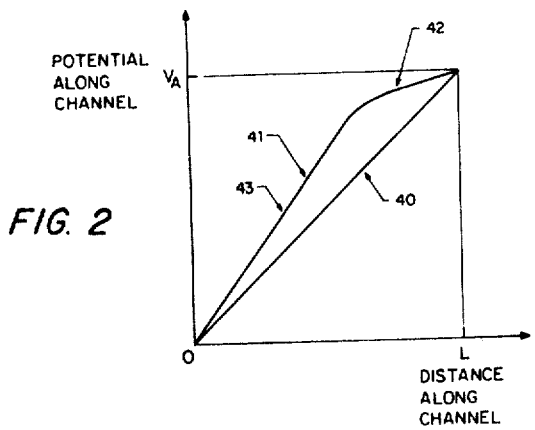
FIG. 2 is a graph showing field deformation in a current saturated channel electron multiplier.

Referring to FIG. 1, a straight channel electron multiplier 10 is shown; it may be made from any material suitable for the obtention of the desired uniform resistivity along the whole length of the channel and the desired high secondary emission coefficient on the inner wall of the tube. For example, tubes made with an inner surface 12 of reduced lead glass with a resistance of $10^8$ to $5 \times 10^9$ $\Omega$ have been tested successfully, the length to diameter ratio being 35 to 100 and the inner diameter 1 mm. Electrical contacts 13, 14, are provided at both ends and a polarizing current as shown at 16 is allowed to flow in the semi-conducting layer 12 when a potential difference $V_A$ shown at 15 is applied between the two extremities 13, 14 of the channel, the upper arrow at 16 being oriented in the direction of the electron current. If the semi-conducting layer 12 is uniform, a uniform potential gradient will be established along the channel as shown in FIG. 2 at 40, L being the length of the channel and $V_A$ the applied potential difference 15. If a particle, such as an ion from the residual gas of the vacuum system, hits the secondary emissive surface at the input end 17 with sufficient energy to eject secondary electrons, the latter will be multiplied by successive collisions with the inner wall 12 of the channel 12, resulting in a high electron density in the output region 18. In this region 18, collision with molecules present in the vacuum system will cause ions 19, 20, 21 to be produced and accelerated back toward the input end 17 which becomes an output for the ion current. Because of their low transverse thermal velocities and their higher masses, the ions will have more elongated trajectories such as shown at 22, 24, 25 compared with the shorter trajectories of the secondary electrons 23. Some of the ions as 21 will strike the channel at grazing angle near the input end. Others will be ejected outside the channel as ion 20 whose trajectory is shown at 24. Because of ion trajectories like 25, a small amount of ion feedback is possible but it has been found that the ion current soon dies out even at high pressures like $10^{-4}$ torr so that the ion source must be externally triggered if continuous ion output current is desired. However, the ion feedback may be increased if a narrowing 26 is produced in the region 17 of the channel. For example, an aperture of 0.5 mm diameter for a 1 mm diameter channel has been found to work well. The narrowing 26 thus intercepts ion trajectories like the one shown at 22, thus increasing the ion feedback. In such a system, if the number of electrons released by the returning ions is greater than the number of electrons released by the exciting particle, it is possible to have an avalanche. Fortunately, the electron current will not build up too far because of the channel multiplier saturation. This phenomena is illustrated in FIG. 2. When a high electron current takes place inside the channel, the supply electrons are taken from the semi-conducting layer 12, and these electrons no longer contribute to the establishment of a uniform potential gradient like 40 in the channel. Instead, the potential gradient is modified as shown at 41; a region of low field 42 is formed where at least no amplification of the electron current occur and a region of high field 43 is created with the result that the overall electron gain of the tube is sharply reduced. The avalanche is thus forced to reach an equilibrium state where the ion and electron currents are constant inside the channel. This type of operation is called self-sustained cascade mode. The ion current I+ shown at 24 is collected by an electrode 27 and measured by an ammeter 28.

Figure 3:
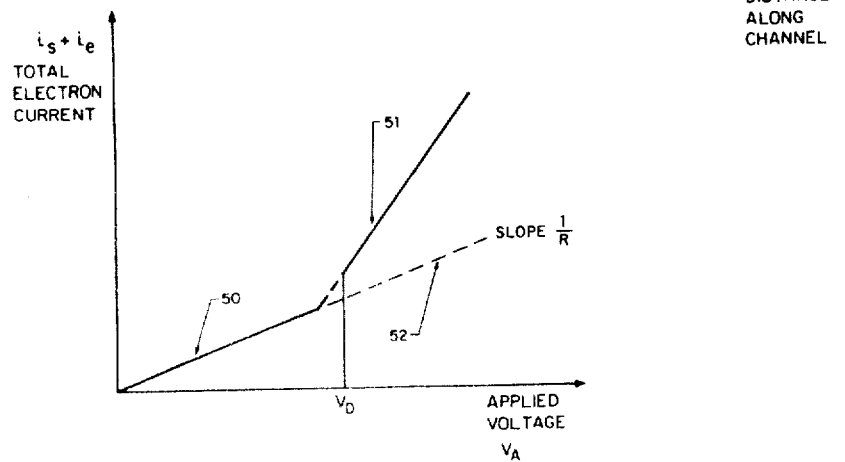
FIG. 3 is the current-voltage characteristic of a straight channel electron multiplier operated in the self-sustained cascade mode.

The channel may also serve as an electron source. The electrons emerging from the region 18, because of field deformation, have very low energies and must be accelerated by a potential difference $V_B$ shown at 29 in order to reach the electrode 30 to be measured as a current $i_e$ by an ammeter 31. In FIG. 3 is shown a typical current-voltage characteristic obtained by varying the voltage $V_A$ shown at 15 and plotting the total current $i_s + i_e$ as a function of $V_A$ where $i_s$ is the strip current measured at 16 and $i_e$ is the free electron current measured at 31. The voltage $V_D$ which is the starting voltage for the self-sustained cascade mode is a function of the pressure in the vacuum system, of the geometry and of secondary emission characteristics of the channel. For low applied voltage, the characteristic $i_s$ 50 is essentially ohmic since there is no free electron and ion currents in the channel. For values of voltages greater than $V_D$, the self-sustained cascade mode appears and part 51 of the characteristic curve is attained. This part 51 of the I-V curve is nearly linear and the values of the total electron current are greater than the value given by Ohm's law shown at 52. For example, resistance R of the semi-conducting strip measured at the two ends of the channel between terminals 13 and 14 may be $5.6 \times 10^8 \, \Omega$, the channel inner diameter being 1 mm and the length to diameter ratio 70, the output aperture 17 having a diameter of 0.5 mm. At a pressure of $2 \times 10^{-5}$ torr in the vacuum chamber the total current $i_s + i_e$ is about 15 μA at an applied voltage $V_A$ of 3500 V, the starting voltage $V_D$ being less than 3000 V. The ejected ion current I+ is approximately $10^{-9}$ to $10^{-8}$ A.

Figure 4:
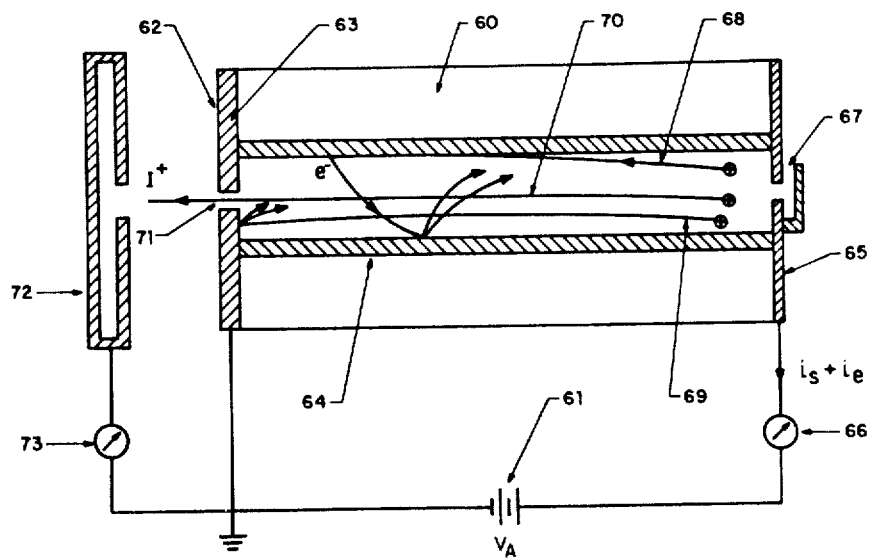
FIG. 4 is a longitudinal sectional view of a second embodiment of the present invention.

FIG. 4 shows an other embodiment of the present invention with a straight channel multiplier 60 and an applied voltage 61. In this case, the narrowing shown at 26 in FIG. 1 is replaced by a metallic emitting electrode 62 having an inner face 63 covered with a secondary emitting material such as $Al_2O_3$ for example. The emitting electrode 62 is in electrical contact with the semi-conductive and secondary emitting layer 64. The free electron current is collected by an electrode 65 together with the strip current and the value of the total current is measured by the ammeter 66. The electrode 65 is provided with a gas inlet 67 by which a gas of desired composition is introduced. In the self-sustained cascade mode of operation, the ion trajectories like those shown at 68,69 will provide the desired ion feedback while the ion current of the source will be obtained from trajectories of the type shown at 70, leaving the channel through the hole 71 of electrode 62. The ion current is collected by electrode 72 and measured by the ammeter 73. Currents are of the same order of magnitude as those obtained with the arrangement shown in FIG. 1. Constructional difficulties are avoided and the size of the hole 71 in the emitting electrode 62 can be varied without modifying the channel shape.

Figure 5:
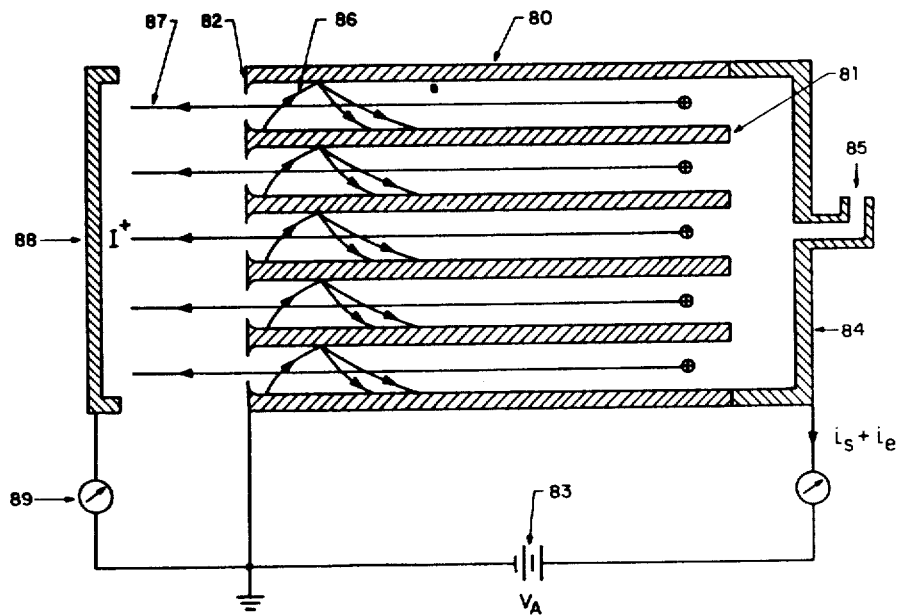
FIG. 5 shows a plurality of sources of the type shown in FIG. 1 arranged to produce a more intense ion beam.

FIG. 5 shows an array of ion sources 80 of the type illustrated in FIG. 1. The channels are placed in a parallel arrangement and metallic electrical contacts are deposited at each end 81,82 of the bundle so that a common polarizing voltage 83 can be applied between the terminals 81, 82. Electron collection is done by electrode 84 in which a gas inlet 85 is provided. All the channels are to be operated in the self-sustained cascade mode with electron trajectories in the direction shown at 86 and the ion trajectories shown at 87. The ion current is collected by the electrode 88 and measured by the ammeter 89.

Ion production by collisions of electrons with molecules or atoms in a gas is proportional to the distance traveled by electrons in the gas. It is also proportional to the number of those electrons. In order to increase the ion current delivered by a channel ion source, the free electron current may be increased. A higher ion current will be obtained by decreasing the strip resistance of the semi-conducting channel. However, thermal run away will occur for values of the strip resistance that are too low so that a good compromise is about $10^8 \, \Omega$ for the value of the resistance of the semi-conducting channel. Having set this value, the electron current (assuming good secondary emission properties of the channel inner surfaces) that can be drawn from the semi-conducting channel inner wall is limited by the current saturation as described above. Using a parallel array like that shown in FIG. 5 is one solution for increasing the total free electron current and thus the resulting ion current. This is done at the expense of the beam collimation: a more intense beam is obtained but its diameter is larger. Another solution is to increase the length of the electron paths. Inside the channel multiplier the maximum length of the electron paths is limited by the channel dimensions so that the electrons produced by the multiplication process are not used very efficiently. This can be seen when comparing for example typical values of the free electron current (10 μA) and the values of the ejected ion current ($10^{-9}$ to $10^{-8}$ A). This means that for every ion produced, more than 1000 electrons are needed. These electrons are collected at the end of the channel for example by electrode 67 in FIG. 4. Of course, one can also increase the pressure of the gas introduced at 67 in order to produce more ions but this is not desirable because a vacuum as good as possible is desired in region 71 in most applications. If the free electron current, instead of being collected by an electrode like 65 in FIG. 4 were allowed to collide with the gas molecules over a longer distance, then it would be possible to produce higher ion currents.

Figure 6:
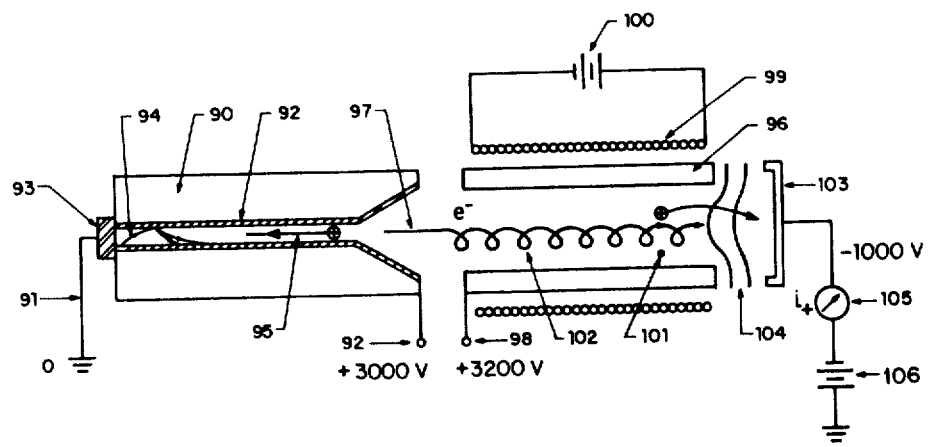
FIG. 6 shows another embodiment of the present invention wherein ions are extracted from the electron emitting side region of a channel ion source.

FIG. 6 shows how this can be done. First, a straight channel multiplier 90 is operated in the self-sustained cascade mode with the applied potentials at its terminals being shown at 91,92. As explained above, an emitting electrode 93 is placed at the end of the channel 90 in electrical contact with the semi-conducting and secondary emissive layer 92, the electron trajectories being shown at 94 and ions trajectories at 95. A metallic tube 96 is placed in front of the enlarged multiplier electron output 97 and a voltage as shown at 98 is applied to the tube 96. The voltage 98 may be a few hundred volts higher than the voltage 92 in order to accelerate the electrons ejected by the channel. A coil 99, supplied by the battery 100, provides a longitudinal magnetic field inside the region 101. This field produces a collimation of the electron beam emitted by the channel and prevents the collection of the electrons by the tube 96. The electrons follow helical paths as shown at 102. An ion extracting electrode 103 polarized by the battery 106 is positioned at the output end of the tube 96 to collect the ion current produced by the collisions of the electrons with molecules and atoms in the region 101. A few equipotentials 104 are sketched near the output end of the tube 96. The extracting field in the region 104 accelerates the ions toward electrode 103 while the magnetic field keeps them on the axis region of tube 96 in order that they reach electrode 103 without being collected by the tube 96. The enlargement in region 97 serves two purposes. First, it will prevent secondary electrons in the last stage of the multiplier to undergo impacts with the final part of the tube and lose energy. Thus, they can be accelerated by the potential gradient in region 97 and then by the potential difference between 98 and 92. They will then move along helical trajectories through the tube 96 and lose a part or all of their energies by ionizing the molecules or atoms in the tube 96. Some will reach region 104 where they will be electrostatically reflected back in region 101, lose energy by collisions, be reflected again in region between 97 and 102 and this process can go on until they have lost all their energy. Thus, the path of the electrons has been increased greatly and this will result in a greater production of ions. The second purpose of the enlargement of the region 97 and the correspondingly larger diameter of the tube 96 is to prevent the collection of ions by tube 96 when they move in helical paths. The magnetic field needed is thus much lower than if the ions trajectories where constrained to a helix of very small radius. As a numerical example, a straight channel multiplier 90 with length to diameter ratio of 35 used with an $Al_2O_3$ emitting electrode 93 with an applied voltage 1500 V at 92 and also at 98 was operated in the self-sustained cascade mode at an ambient pressure of $5 \times 10^{-4}$ torr. The current in the 450 turns coil 99 was 1A and its length was 5.8 cm. The inner diameter of the tube 96 was 1 cm. The voltage applied on electrode 103 was $-2000$ V and the ion current measured at 105 was in the range $10^{-7} - 10^{-6}$ A.

Figure 7:
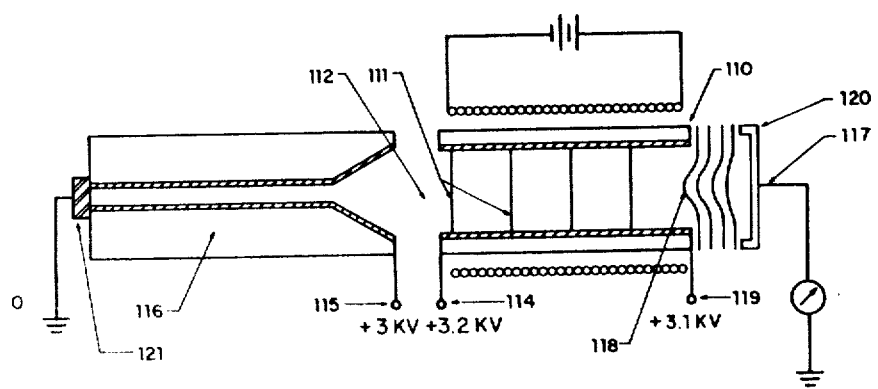
FIG. 7 shows another embodiment of the present invention.

FIG. 7 shows how the need for an extracting voltage can be eliminated by the use of a semi-conducting channel 110 in place of the tube 96. The principle of operation is the same as described for the device shown in FIG. 6. The only difference is that instead of having a penetrating field whose equipotentials are shown at 104, there is a uniform potential gradient inside the tube 110 with a few equipotential lines sketched at 111. The injected electrons at 112 have, for example, an energy of little more than 200 eV as determined by the potential difference between points 114 and 115, the channel multiplier 116 being operated in the self-sustained cascade mode. The semi-conducting material used to make the tube 110 may be of the same nature as that used to make channel 116. Moreover, channel 116 and tube 110 may be fabricated in a single unit, a supplementary section of tube being added between points 115 and 114 to preserve the potential gradient between these points. Electrical contacts must be installed at points 121, 114 and 119. Electrons having more than 200 eV are decelerated until they reach the region 118 where the decelerating field is more intense. They are reflected and reaccelerated by the potential difference between points 114 and 119 and lose energy by collisions when traveling back and forth into the tube. Ions produced as a result of these collisions will be accelerated and captured by electrode 120 or ejected through an aperture placed at 117 in electrode 120.

The embodiments of the invention in which an exclusive property or privilege is claimed are defined as follows:

1. An ion-electron source, comprising:
    a substantially straight tubular electron multiplier channel having an output aperture therein for ejecting ion-current formed therein;
    inlet means for pressurizing the interior of said channel with a gas to a predetermined pressure; and
    voltage polarization means for biasing said electron multiplier;
    said channel including a feedback emitting region for intercepting some ions traveling a trajectory generally toward said aperture and emitting secondary electrons in response to ion interception, the intercepted ions and secondary electrons providing sufficient ion feedback to operate said electron multiplier in a self-sustained cascade mode.

2. An ion-electron source according to claim 1 wherein said feedback emitting region comprises a narrowed portion of said channel at one extremity thereof.

3. An ion-electron source according to claim 1 wherein said feedback emitting region comprises an electrode having a surface coated with a high secondary electron emission coefficient substance.

4. An ion-electron source as defined in claim 1, 2 or 3, comprising a plurality of said straight tubular channels in a parallel arrangement to produce a more intense beam.

5. An ion-electron source, comprising:
    a substantially straight tubular electron multiplier channel having an output aperture therein for ejecting electron current formed therein; said electron multiplier channel including a feedback emitting region for intercepting some ions produced within said channel and emitting secondary electrons in response to ion interception, the intercepted ions and secondary electrons providing sufficient feedback to operate said channel in a self-sustained cascade mode;
    a gas inlet for providing within said channel a predetermined pressure of a gas;
    a high voltage polarizing means for biasing said electron multiplier channel;
    a conducting tube having an axis substantially colinear with the axis of said electron multiplier channel, said conducting tube defining an ionizing region for ionizing atoms and molecules therein;
    means for providing a magnetic field within said conducting tube; and
    an ion extracting electrode for collecting ion current formed within said conducting tube.

6. An ion-electron source according to claim 5 wherein said feedback emitting region comprises a narrowed portion of said channel at one extremity thereof.

7. An ion-electron source as defined in claim 5, wherein said feedback emitting region is formed by an electrode having a surface coated with a high secondary electron emission coefficient substance.

8. An ion-electron source as defined in claim 5, 6 or 7, comprising a plurality of straight channel electron multipliers in parallel arrangement to obtain a higher electron current.

9. An ion-electron source, comprising
    a substantially straight tubular electron multiplier channel having an output aperture therein for ejecting electron current formed therein; said electron multiplier channel including a feedback emitting region for intercepting some ions produced within said channel and emitting secondary electrons in response to ion interception, the intercepted ions and secondary electrons providing sufficient feedback to operate said channel in a self-sustained cascade mode;

a gas inlet for providing within said channel a predetermined pressure of a gas;

a high voltage polarizing means for biasing said electron multiplier channel;

a semi-conducting tube having an axis substantially colinear with the axis of said straight channel electron multiplier, said semi-conducting tube defining an ionizing region for ionizing atoms and molecules therein and contributing to an accelerating extracting field in said ionizing region;

means for providing a magnetic field within said semi-conducting tube; and an ion extracting electrode for collecting ion current formed within said semi-conducting tube.

10. An ion-electron source as defined in claim 9, wherein said semi-conducting tube and straight channel electron multiplier are fused in a single unit.

11. An ion-electron source as defined in claim 10, comprising a plurality of said units placed in a parallel arrangement to obtain higher ion or electron currents.

* * * * *